United States Patent
Frankland et al.

(10) Patent No.: US 7,511,571 B2
(45) Date of Patent: Mar. 31, 2009

(54) SINGLE-ENDED SCREEN-REGULATED CATHODE-FOLLOWER OUTPUT STAGE FOR HIGH-FIDELITY MUSIC AMPLIFIER

(76) Inventors: Scott Frankland, 11271 Enchanto Vista, San Jose, CA (US) 95127; Martin G. Reiffin, 47 Pheasant Run Ter., Danville, CA (US) 94506

( * ) Notice: Subject to any disclaimer, the term of this patent is extended or adjusted under 35 U.S.C. 154(b) by 84 days.

(21) Appl. No.: 11/490,453

(22) Filed: Jul. 21, 2006

(65) Prior Publication Data
US 2008/0018397 A1    Jan. 24, 2008

(51) Int. Cl.
*H03F 1/00* (2006.01)
(52) U.S. Cl. .......................................... 330/71; 330/153
(58) Field of Classification Search ................. 330/168, 330/173, 193, 127, 123
See application file for complete search history.

(56) References Cited

U.S. PATENT DOCUMENTS

| | | | | |
|---|---|---|---|---|
| 2,955,261 A * | 10/1960 | Edwards | ....................... | 330/89 |
| 3,092,783 A * | 6/1963 | Krohn | .......................... | 330/98 |
| 3,428,912 A * | 2/1969 | Wolcott | ....................... | 330/74 |
| 5,859,565 A | 1/1999 | Reiffin | | |
| 6,265,938 B1 | 7/2001 | Reiffin | | |
| 6,759,901 B2 * | 7/2004 | Fryette | ....................... | 330/127 |

* cited by examiner

*Primary Examiner*—Robert Pascal
*Assistant Examiner*—Hieu P Nguyen

(57) ABSTRACT

A novel single-ended screen-regulated cathode-follower output topology for implementing vacuum-tube audio power amplifiers for the reproduction of high-fidelity music with minimal audible distortion. The screen regulation substantially reduces the distortions and noise in the current fed to the output tube by a non-regulated power supply. The noise and distortion of the power supply voltage are thereby prevented from intermodulating with and distorting the music signal.

19 Claims, 1 Drawing Sheet

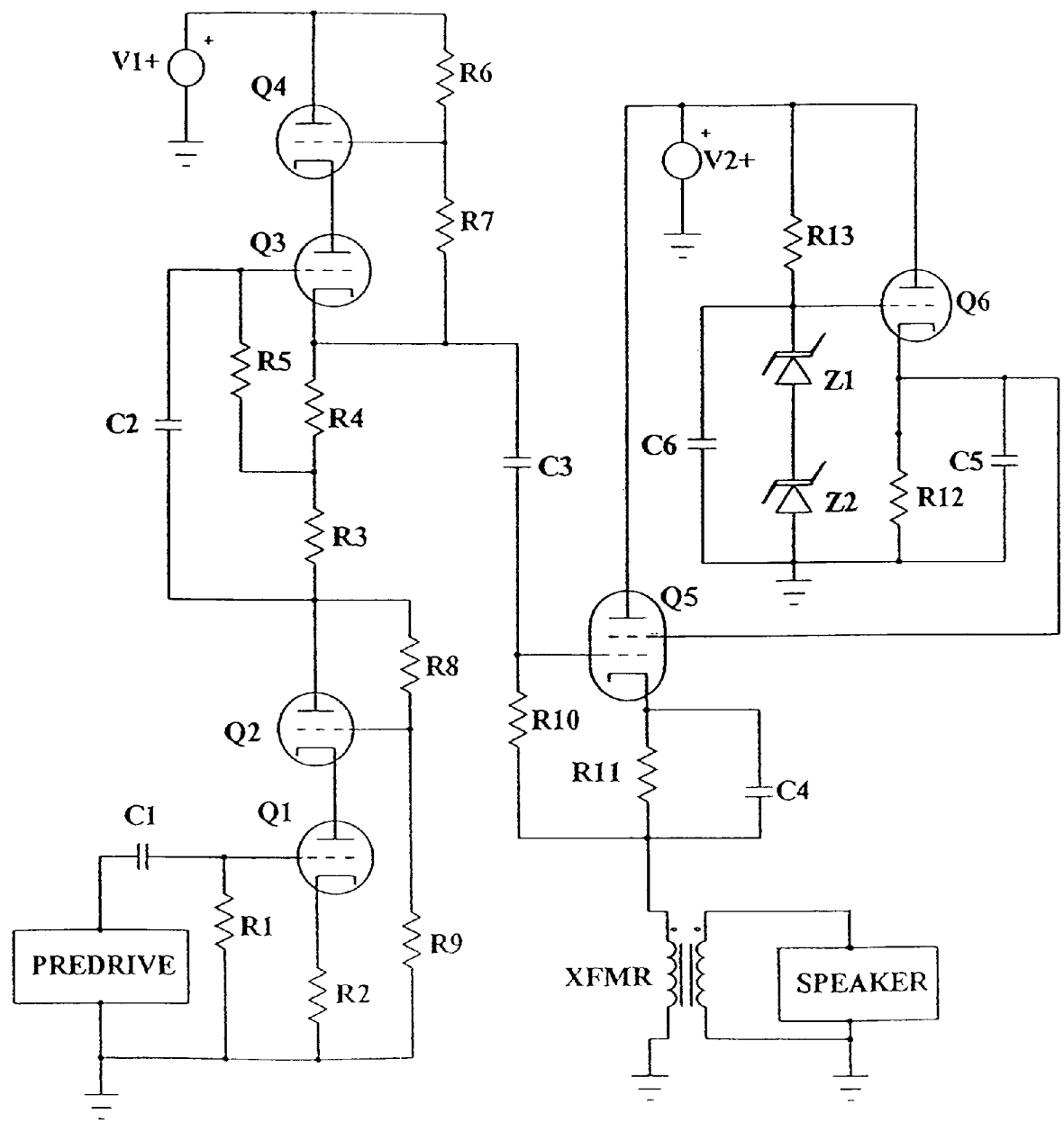

SINGLE-ENDED SCREEN-REGULATED CATHODE-FOLLOWER OUTPUT STAGE FOR HIGH-FIDELITY MUSIC AMPLIFIER

I. BACKGROUND OF THE INVENTION (1) Field of the Invention

This invention relates to a novel single-ended screen-regulated cathode-follower output topology for implementing vacuum-tube audio power amplifiers to provide for the reproduction of high-fidelity music with minimal audible distortion.

The present invention is an improvement over the amplifiers disclosed in prior U.S. Pat. No. 5,859,565 entitled "CATHODE-FOLLOWER HIGH-FIDELITY POWER AMPLIFIER" issued Jan. 12, 1999, and prior U.S. Pat. No. 6,265,938 entitled "LINEAR HIGH-VOLTAGE DRIVE STAGE AND CATHODE-FOLLOWER HIGH-FIDELITY AMPLIFIER IMPLEMENTING SAME" issued Jul. 24, 2001. The present improvement resides in the novel combination of an output tube having its screen grid voltage regulated so as to maintain the plate-to-cathode current relatively immune to noise and distortion in the power supply, while providing all the advantages of the cathode-follower operation described in said patents and summarized herein below.

(2) Description of the Prior Art

In the past decade of the art of high-fidelity audio reproduction it has come to be recognized by many audiophiles and amplifier designers that vacuum-tube amplifiers can provide superior music reproduction as compared with transistor amplifiers. These tube amplifiers generally have output stage configurations which are either push-pull or single-ended. It is well-known that the single-ended topology has both advantages and disadvantages with respect to the push-pull topology. A primary object of the present invention is to provide a new single-ended topology which retains these advantages while obviating several major disadvantages.

(A) ADVANTAGES OF SINGLE-ENDED AMPLIFIERS

It is generally recognized that the single-ended-triode amplifier provides more linear reproduction of the midrange frequencies, thereby providing "a presence and immediacy of musical communication", "a wonderful liquidity and purity of timbre that is completely devoid of grain, hardness, and other artifacts of push-pull amplifiers", and "a directness of musical expression that is immediately understood by anyone who has listened". (Ref. 11, Harley, R., "The Complete Guide to High-End Audio, $3^{rd}$ edition, Acapella, 2004, pp. 174-178.) All references are to the publications listed in the Bibliography at the end of this specification. There are several reasons for this superiority of the single-ended amplifier.

First, at lower power levels the operating point of the single-ended amplifier remains along the relatively linear portion of the magnetic B-H characteristic curve (flux density B vs. field intensity H) of the output transformer iron core. On the other hand, in a push-pull amplifier the operating point repeatedly crosses over the region at the origin of the B-H curve where the curve has a nonlinear "kink". That is, at the origin "the individual magnetic domains that make up the core have stiction in reversing the polarity of their magnetism". The operating point of the single-ended amplifier "avoids this region, and the transfer characteristic is more linear, which perhaps explains the claims for excellent midrange detail in this breed of amplifiers". (Ref. 12, Jones, M., Valve Amplifiers", Newnes, 1995, p. 197).

Second, the single-ended amplifier operates in Class A mode. That is, the output tube remains conductive. This is opposed to the Class AB mode of the usual push-pull amplifier where one output tube conducts for about one-half cycle and then turns off for a substantial portion of the next half-cycle while the other output tube then takes over. This switching of the load from one tube to the other results in a nonlinearity called "cross-over distortion".

Third, push-pull operation requires a phase-splitter giving rise to increased complexity and frequently results in two drive signals having unbalanced magnitudes or impedances.

Fourth, the linearity of the push-pull amplifier deteriorates as the tubes become unbalanced due to aging of the tubes or aging of the other circuit components which affect the tube balance, or due to changes in the supply voltages.

Fifth, the harmonic distortion of a properly designed single-ended amplifier is composed primarily of the second-order harmonic which is relatively euphonic as contrasted with the relatively discordant third, fifth and higher order odd harmonics generated by the typical push-pull amplifier.

(B) DISADVANTAGES OF THE SINGLE-ENDED AMPLIFIER

However, the single-ended amplifier has a major disadvantage which is obviated by the present invention which, in this respect, is an improvement over the topologies disclosed and claimed in said prior U.S. Pat. Nos. 5,859,565 and 6,265,938. That is, the single-ended amplifier is susceptible to ripple, hum, voltage sags, electrical interference, electromagnetic radiation, and other distortions and noise in the current fed to the output tube by the power supply. These distortion and noise components intermodulate the music signal being amplified and thereby generate added distortion components which adversely affect the fidelity of the music signal. These noise components also result in audible hum, particularly when the amplifier is used with efficient speakers having high sensitivity. In the push-pull amplifiers these noise components appear in both halves of the transformer primary winding and tend to buck each other and cancel out so that the power supply noise problem is substantially reduced.

It is for these reasons that the highest quality single-ended amplifiers provide a regulated power supply so as to eliminate these noise and distortion components from the current supplied to the output tube. However, this is a very expensive solution to the problem and about doubles the cost of the amplifier, thereby putting the amplifier beyond the means of most consumers. This expensive solution also puts an economic limit on the design maximum power output.

Further disadvantages of the conventional single-ended amplifier are explained in detail in said prior U.S. Pat. Nos. 5,859,565 and 6,265,938 and are obviated by these patented topologies. Several features of these patented topologies are also implemented in the present invention and are included in the combination recited in several of the present claims set forth below. These further disadvantages are briefly summarized below.

The conventional single-ended output stage usually operates in the common-cathode mode. This results in a relatively large output tube plate resistance which exacerbates the deleterious effects of the primary inductance, leakage inductance and winding capacitance of the transformer. That is, a single-ended amplifier requires a large air gap in the transformer core to prevent saturation, thereby reducing the primary inductance and increasing the distortion due to the resulting steep elliptical loadline traversed by the tube operating point at low frequencies. Further, the high source impedance, inherent in the common-cathode mode, also increases the distortion due to the nonlinear magnetization current of the transformer core. It also results in a high amplifier output impedance at the speaker terminals thereby providing a low amplifier damping factor and poor speaker transient response. A further disadvantage of the high source impedance of the common-cathode output stage is the resulting frequency response nonlinearity when driving typical speakers which have an impedance which varies with frequency. In addition, the high source impedance of the plate resistance coacts with the leakage inductance and winding capacitance of the output transformer to generate phase shift and rolloff at high frequencies. The common-cathode mode also results in a high Miller-effect capacitance at the input of the output stage. Several of the above-described disadvantages of the common-cathode output stage are explained in more detail at Pages 214-217, 229-233 of the Radiotron Designer's Handbook (Ref. 3).

(C) DISADVANTAGES OF THE CATHODE-FOLLOWER SINGLE-ENDED AMPLIFIER

It was well-known in the prior art that a lower output impedance and reduced distortion in the output stage can be obtained with a cathode-follower configuration. That is, instead of the output transformer primary winding being connected in series between the power supply B+ terminal and the output tube plate as implemented in the usual common-cathode topology, the transformer winding is connected in series between the output cathode and the ground. This topology was regarded as impractical because it requires a large drive voltage which would result in high distortion. Gilson and Pavlat (Ref 4); Radiotron Designer's Handbook (Ref 3, p. 596); Crowhurst (Ref 5). This problem is obviated by the novel drive stage disclosed in said patents and summarily described below. Several of the present claims recite combinations which include aspects of this drive stage.

(D) THE NOVEL DRIVE STAGE

Although it was known that lower output impedance and reduced distortion can be obtained by utilizing a cathode-follower mode of operation for the output configuration, this mode of operation had been impractical because the cathode-follower output stage requires a very large drive signal. Said prior Patents obviated this problem by utilizing a novel drive stage to provide the required large drive signal. This novel drive stage comprises series connected tubes which share the large static and dynamic voltages of the drive stage so as to provide with low distortion the large voltage signal required to drive the cathode-follower output stage, and without subjecting the drive stage tubes to excessively high voltages.

II SUMMARY OF THE PRESENT INVENTION

It is therefore a primary object of the present invention to provide a novel cathode-follower output stage topology which substantially reduces the ripple, hum, voltage sags, electrical interference, electromagnetic radiation, and other distortions and noise in the current fed to the output tube by a non-regulated power supply. These distortion and noise components, even when not audible in themselves, intermodulate with and distort the signal being amplified. Because the tube plate-to-cathode current is determined primarily by the screen voltage and is relatively independent of variations in the plate voltage, regulation of the screen voltage substantially eliminates these noise and distortion components from the plate-to-cathode current. The noise and distortion components of the power supply voltage applied to the plate are thereby prevented from intermodulating the music signal so as to generate audible distortion.

This novel cathode-follower output topology is neither a triode nor a pentode nor a tetrode. It is not a triode because it requires an output tube having a screen grid. It is not a triode-connected pentode or tetrode because the screen grid is not connected to the plate. It is not a pentode or tetrode because the screen grid is not maintained at a constant potential with respect to the cathode. (Ref. 5, Crowhurst, Norman H., *Understanding Hi-Fi Circuits*, Gemsback Library, 1957, pp. 26, 27.) Instead, the screen grid is connected to a voltage regulator and thereby maintained at a constant potential with respect to ground rather than with respect to the cathode as in a pentode or tetrode. Since the current through the tube is determined primarily by the voltage on the screen, the plate-to-cathode current through the output tube is maintained relatively clean and devoid of noise and distortions fed to the plate by the power supply.

III. BRIEF DESCRIPTION OF THE DRAWING

The drawing is a schematic circuit diagram showing a preferred illustrative embodiment of the invention and comprising one or more conventional amplification stages designated PREDRIVE, in cascade with a drive stage for driving a cathode-follower output stage in turn driving an output transformer, and a voltage-regulator circuit applying a constant voltage to the screen grid of the output stage tube.

IV. DETAILED DESCRIPTION OF THE PREFERRED EMBODIMENT

Referring to the drawing in more detail, the amplified audio input signal from the output of the PREDRIVE amplification stage is transmitted to the grid of tube Q1 of the novel drive stage further comprising tubes Q2, Q3 and Q4. The drive stage is preferably in accordance with said U.S. Pat. No. 6,265,938. The output signal of the drive stage is taken at the cathode of tube Q3 which is coupled by capacitor C3 to the grid of power output tube Q5. The cathode of output tube Q5 is connected to the primary of an output transformer XFMR having its secondary connected to a loudspeaker system designated SPEAKER.

The voltage at the screen grid of output tube Q5 is regulated by the voltage regulator circuit comprising tube Q6. Regulator tube Q6 is shown as a triode for simplicity in illustration, but may as well be a pentode or beam power tube. It should be understood that any conventional voltage regulator may be used for this purpose and that the specific details of the disclosed voltage regulator are not essential to the operation of the invention. For purposes of illustration of one of the many forms which the voltage regulator may take, the grid of tube Q6 is maintained at a substantially constant potential by a series connected string of Zener diodes (e.g. the two diodes Z1 and Z2 shown in the drawing) supplied with current through resistor R13 connected to the voltage supply terminal V2+. The cathode of tube Q6 is connected to bias resistor R12 having its opposite end connected to ground. A bypass capacitor C5 is connected across resistor R12. The cathode of tube 6 is thereby maintained at a substantially constant potential which is applied to the screen grid of output tube Q5. Since the current through output tube Q5 is determined primarily by the screen voltage, the noise and distortions supplied by the unregulated power supply V2+ to the plate of output tube Q5 have minimal effect on the current flowing through the tube.

As disclosed in said U.S. Pat. No. 6,265,938 the drive stage tubes are series connected with the plate of the first drive stage tube Q1 connected to the cathode of the second drive stage tube Q2. The plate of the latter tube is connected to the cathode of the third drive stage tube Q3, and the plate of the latter tube is connected to the cathode of the fourth drive stage tube Q4. It should be understood that although tubes Q1 to Q4 are shown in the drawing as triodes, any of them may be pentodes if desired. The respective quiescent and dynamic voltages across each drive tube are maintained approximately equal by the two voltage dividers R6,R7 and R8,R9, as explained in said U.S. Pat. No. 6,265,938. Drive tube Q1 is provided with a cathode bias resistor R2 and a grid leak resistor R1. Resistors R4 and R5 provide the same functions for drive tube Q3. The voltage drop across the plate load resistor R3 is transmitted by coupling capacitor C2 to the grid of drive tube Q3.

The overall topology of the drive stage may be regarded as a novel mu-follower circuit having approximately twice the maximum voltage swing as a conventional mu-follower, thereby providing the amplifier with approximately four times the power output that would be provided by a conventional mu-follower drive circuit.

Output tube Q5 is shown as a tetrode for simplicity in illustration, but may instead be a pentode (e.g. EL34), or beam power tube (e.g. 6550 or KT88). The cathode of output tube Q5 is connected through bias resistor R11 to the upper end of the primary of the output transformer XFMR having its lower end connected to ground. A bypass capacitor C4 is connected in parallel with resistor R11. A grid leak resistor R10 is connected between the grid of output tube Q5 and the lower end of bias resistor R11.

The specific embodiment disclosed in the specification and drawings is merely illustrative of one of the many forms which the invention may take in practice without departing from the scope of the invention which is defined in the appended claims.

BIBLIOGRAPHY

Incorporating by reference and augmenting the Bibliography in said prior patents:
   3. Radiotron Designer's Handbook, pp. 214-217, 229-233.
   5. Crowhurst, Norman H., *Understanding Hi-Fi Circuits*, Gemsback Library, 1957, pp. 26, 27.
   11. Harley, R., *The Complete Guide to High-End Audio*, 3rd edition, Acapella, 2004, pp. 174-178.
   12. Jones, M., *Valve Amplifiers*, Newnes, 1995, p. 197).

We claim:
1. A vacuum tube amplifier comprising
a single-ended cathode-follower output stage including an output tube having a plate, a cathode, and a screen grid,
a power supply connected to said plate,
output terminals for connection to a speaker system,
circuitry connecting said cathode to said output terminals,
a ground, and
a voltage-regulator circuit connected to said screen grid for maintaining said screen grid at a constant potential with respect to said ground.
2. A vacuum tube amplifier as recited in claim 1 wherein said vacuum tube has a control grid,
an amplification circuit connected to said control grid,
said connecting circuitry comprising an output transformer having a primary winding connected to said cathode and a secondary winding connected to said output terminals.
3. A vacuum tube amplifier as recited in claim 2 wherein said amplification circuit comprises
a drive stage including at least one drive tube having a grid and a plate,
a signal input node connected to the grid of said drive tube, and
an active load impedance connected to the plate of said drive tube.
4. A vacuum tube amplifier as recited in claim 2 wherein said drive stage includes at least two tubes each having a grid, a cathode and a plate,
said tubes being connected in series with the plate of a first tube connected to the cathode of a second tube so that a common plate-to-cathode current flows through the tubes in series,
a signal input node connected to the grid of said first tube,
an active load impedance connected to the plate of said second tube, and
a voltage divider network connected to the grid of said second tube to provide that said tubes share the total voltage across both tubes.
5. An amplifier as set forth in claim 4 wherein said active load impedance comprises
at least two series-connected tubes each having a grid, a plate and a cathode,
said load impedance tubes being connected in series with the plate of a first tube connected to the cathode of a second tube so that a common plate-to-cathode current flows through the load impedance tubes in series, and
a second voltage divider network connected to provide that said load impedance tubes share the total voltage across both of said load impedance tubes.
6. A vacuum tube amplifier as recited in claim 2 wherein said amplification circuit comprises a drive stage including at least two tubes each having a grid, a cathode and a plate,
said drive stage tubes being connected in series with the plate of a first tube connected to the cathode of a second tube so that a common plate-to-cathode current flows through the tubes in series,
a signal input node connected to the grid of said first tube,
said active load impedance being connected to the plate of said second drive stage tube,
a first voltage divider network connected to the grid of said second drive stage tube to provide that said tubes share the total voltage across both tubes,
said active load impedance comprises at least two series-connected tubes each having a grid, a plate and a cathode,
said load impedance tubes being connected in series with the plate of a first tube connected to the cathode of a second tube so that a common plate-to-cathode current flows through the load impedance tubes in series, and
a second voltage divider network connected to provide that said load impedance tubes share the total voltage across both of said load impedance tubes.
7. A vacuum tube amplifier as recited in claim 1 wherein said power supply is unregulated and supplies to said plate a current having noise, ripple, voltage sags and other undesirable distortion components, and
said voltage-regulator circuit supplies to said screen grid a substantially constant voltage relatively free of said undesirable distortion components, whereby the plate-to-cathode current through said tube is determined primarily by the constant voltage supplied to said screen grid, and is thereby relatively unaffected by said distortion components supplied to said plate by the unregulated power supply.

8. A vacuum tube amplifier as recited in claim 7 wherein said amplification circuit comprises
a drive stage including at least one drive tube having a grid and a plate,
a signal input node connected to the grid of said drive tube, and
an active load impedance connected to the plate of said drive tube.

9. A vacuum tube amplifier as recited in claim 8 wherein said drive stage includes at least two tubes each having a grid, a cathode and a plate,
said tubes being connected in series with the plate of a first tube connected to the cathode of a second tube so that a common plate-to-cathode current flows through the tubes in series,
a signal input node connected to the grid of said first tube,
an active load impedance connected to the plate of said second tube, and
a voltage divider network connected to the grid of said second tube to provide that said tunes share the total voltage across both tubes.

10. An amplifier as set forth in claim 4 wherein said active load impedance comprises
at least two series-connected tubes each having a grid, a plate and a cathode,
said load impedance tubes being connected in series with the plate of a first tube connected to the cathode of a second tube so that a common plate-to-cathode current flows through the load impedance tubes in series, and
a voltage divider network connected to provide that said load impedance tubes share the total voltage across both of said load impedance tubes.

11. A vacuum tube amplifier as recited in claim 2 wherein said amplification circuit comprises a drive stage including at least two tubes each having a grid, a cathode and a plate,
said tubes being connected in series with the plate of a first tube connected to the cathode of a second tube so that a common plate-to-cathode current flows through the tubes in series,
a signal input node connected to the grid of said first tube,
said active load impedance being connected to the grid of said second tube to provide that said tubes share the total voltage across both tubes,
said active load impedance comprises at least two series-connected tubes each having a grid, a plate and a cathode,
said load impedance tubes being connected in series with the plate of a first tube connected to the cathode of a second tube so that a common plate-to-cathode current flows through the load impedance tubes in series, and
a voltage divider network connected to provide that said load impedance tubes share the total voltage across both of said load impedance tubes.

12. An amplifier as recited in claim 1 wherein said voltage-regulator circuit comprises
a regulator tube including a plate, a grid and a cathode,
a direct-current voltage source,
an impedance extending from said voltage source to said regulator tube grid, a ground,
zener means extending from said regulator tube grid to said ground, and
capacitive means connected in parallel with said zener means.

13. A vacuum tube amplifier for amplifying a music signal with minimal audible distortion and comprising
a drive stage including at least two tubes connected in series to share the voltage across the drive stage,
a cathode-follower output stage connected to said drive stage,
an output transformer connected to said cathode-follower output stage,
means for connecting said output transformer to a loudspeaker system,
said cathode-follower output stage including at least one output tube having a screen grid, and
a voltage-regulator circuit connected to said output tube screen grid to maintain the voltage of the screen grid at an approximately constant voltage as the plate current varies during operation of the amplifier.

14. A vacuum tube amplifier as recited in claim 13 wherein
said power supply is unregulated and supplies to said plate a current having noise, ripple, voltage sags and other undesirable distortion components, and
said voltage-regulator circuit supplies to said screen grid a substantially constant voltage relatively free of said undesirable distortion components,
whereby the plate-to-cathode current through said tube is determined primarily by the constant voltage supplied to said screen grid, and is thereby relatively unaffected by said distortion components supplied to said plate by the unregulated power supply, and
whereby the amplified music signal output by the amplifier is substantially free of modulation by said distortion components.

15. A vacuum tube amplifier as recited in claim 14 wherein said amplification circuit comprises
a drive stage including at least one drive tube having a grid and a plate,
a signal input node connected to the grid of said drive tube, and
an active load impedance connected to the plate of said drive tube.

16. A vacuum tube amplifier as recited in claim 15 wherein said drive stage includes at least two drive tubes each having a grid, a cathode and a plate,
said drive tubes being connected in series with the plate of a first tube connected to the cathode of a second tube so that a common plate-to-cathode current flows through the drive tubes in series,
a signal input node connected to the grid of said first drive tube,
an active load impedance connected to the plate of said second drive tube, and
a voltage divider network connected to the grid of said second drive tube to provide that said drive tubes share the total voltage across both tubes.

17. A vacuum tube amplifier for amplifying a music signal with minimal audible distortion and comprising
a cathode-follower output stage including a vacuum tube having a control grid, a plate, a cathode, and a screen grid,
an amplification circuit connected to said control grid,
an unregulated power supply connected to said plate,
an output transformer connected to said cathode,
output terminals for connecting said output transformer to a speaker system, and a voltage-regulator circuit connected to said screen grid for supplying thereto a substantially constant voltage substantially free of noise and other distortion, whereby the music signal output by the amplifier is substantially free of modulation by the noise and other distortion inherent in the unregulated power supply.

18. A vacuum tube amplifier as recited in claim 17 wherein said amplification circuit comprises a drive stage including at least two tubes each having a grid, a cathode and a plate, said tubes being connected in series with the plate of a first tube connected to the cathode of a second tube so that a common plate-to-cathode current flows through the tubes in series, a signal input node connected to the grid of said first tube, said active load impedance being connected to the plate of said second tube, a first voltage divider network connected to the grid of said second tube to provide that said tubes share the total voltage across both tubes, said active load impedance tubes being connected in series with the plate of a first tube connected to the cathode of a second tube so that a common plate-to-cathode current flows through the load impedance tubes in series, and a second voltage divider network connected to provide that said load impedance tubes share the total voltage across both of said load impedance tubes.

19. An amplifier as recited in claim 18 wherein said voltage-regular circuit comprises a regulator tube including a plate, a grid and a cathode, a d.c. voltage source, an impedance extending from said voltage source to said regulator tube grid, a ground, zener means extending from said regulator tube grid to said ground, and capacitive means extending in parallel with said zener means.

\* \* \* \* \*